United States Patent
Taylor et al.

(10) Patent No.: US 8,679,443 B2
(45) Date of Patent: Mar. 25, 2014

(54) METHOD AND APPARATUS FOR TREATING DIAMOND USING LIQUID METAL SATURATED WITH CARBON

(75) Inventors: Philip H. Taylor, Henley-on-Thames (GB); A. Marshall Stoneham, Dorchester-on-Thames (GB)

(73) Assignee: Designed Materials Ltd, Leicestershire (GB)

( * ) Notice: Subject to any disclaimer, the term of this patent is extended or adjusted under 35 U.S.C. 154(b) by 0 days.

(21) Appl. No.: 13/383,675

(22) PCT Filed: Jul. 19, 2010

(86) PCT No.: PCT/GB2010/001368
§ 371 (c)(1),
(2), (4) Date: Jan. 12, 2012

(87) PCT Pub. No.: WO2011/007156
PCT Pub. Date: Jan. 20, 2011

(65) Prior Publication Data
US 2012/0107212 A1    May 3, 2012

(30) Foreign Application Priority Data

Jul. 17, 2009 (GB) .................................. 0912510.5

(51) Int. Cl.
- *C01B 31/36* (2006.01)
- *B01J 3/06* (2006.01)
- *B01J 3/00* (2006.01)
- *A62D 3/00* (2007.01)
- *C30B 7/00* (2006.01)
- *C30B 21/02* (2006.01)
- *C30B 28/06* (2006.01)
- *C30B 9/00* (2006.01)

(52) U.S. Cl.
USPC ........... 423/446; 423/291; 422/164; 422/199; 117/68; 117/70; 117/71; 117/75; 117/929

(58) Field of Classification Search
None
See application file for complete search history.

(56) References Cited

U.S. PATENT DOCUMENTS

| | | | |
|---|---|---|---|
| 2,947,609 A * | 8/1960 | Strong | 423/446 |
| 3,142,539 A | 7/1964 | Brinkman et al. | |
| 3,906,082 A * | 9/1975 | Shulzhenko et al. | 423/446 |
| 4,339,304 A | 7/1982 | Grigoriev et al. | |
| 5,451,430 A | 9/1995 | Anthony et al. | |
| 7,547,358 B1 * | 6/2009 | Shapiro | 117/68 |
| 8,252,263 B2 * | 8/2012 | Sung | 423/446 |
| 2009/0110626 A1 | 4/2009 | Hemley et al. | |

OTHER PUBLICATIONS

Oikawa et al.; Epitaxial Growth Mechanism of Diamond Crystal in CH4-H2 Plasma; J. A. Che. Soc.; 108, 5780-5783; 1986.*
Search Report issued in Priority Application GB0912510.5, date of search Nov. 4, 2010.
Examination Report issued in Application No. GB0912510.5, date of search Apr. 1, 2011.

(Continued)

*Primary Examiner* — Guinever Gregorio
(74) *Attorney, Agent, or Firm* — Lando & Anastasi, LLP (57) ABSTRACT

A method of treating a diamond, the method comprising: (i) providing a liquid metal saturated with carbon with respect to graphite precipitation; (ii) lowering the temperature of the liquid metal such that the liquid metal is saturated with carbon with respect to diamond precipitation; (iii) immersing a diamond in the liquid metal; and (iv) removing the diamond from the metal.

18 Claims, 5 Drawing Sheets

(56) References Cited

OTHER PUBLICATIONS

International Search Report for PCT/GB2010/001368 mailed Oct. 7, 2010.

Ostrovskaya L. et al., "Wettability and surface energy of oxidized and hydrogen plasma-treated diamond films" Diamond and Related Materials, Elsevier Science Publishers, Amsterdam, NL LNKD-DOI: 10.1016/S0925-9635(01)00636-7, vol. 11, No. 3-6, Mar. 1, 2002, pp. 845-850, XP004357032, ISSN: 0925-9635.

Search Report Issued on Priority Application GB0912510.5 date of search Nov. 11, 2009.

Written Opinion of the International Searching Authority for PCT/GB2010/001368 mailed Oct. 7, 2010.

* cited by examiner

METHOD AND APPARATUS FOR TREATING DIAMOND USING LIQUID METAL SATURATED WITH CARBON

The present invention relates to methods of treating diamond, and in particular to methods of reducing defects in diamond and/or improving the optical properties of diamond. The present invention also provides a method of doping diamond. Moreover, the present invention relates to an apparatus for use in treating diamonds.

Diamond has a number of physical and mechanical properties that enables it to be used in many applications across a wide range of technologies. Desirable properties include extreme hardness, high mechanical strength, chemical inertness, ultra low coefficients of expansion and high thermal conductivity. However, natural diamond is both relatively rare and does not readily occur in a form that lends itself to many applications. The challenge for researchers is to develop methods of creating diamond substrates with the relevant properties on an economically viable scale. Progress in diamond growth techniques based on CVD (Chemical Vapour Deposition) and HPHT (High Pressure, High Temperature) processes has led to the increased availability of such substrates, but problems remain in processing such materials for use in applications where substantial defect engineering is required. This is particularly important in techniques that require diamond to be processed at high temperatures.

The tendency of diamonds to revert to graphite in chemically aggressive environments and high temperatures is well documented. This phenomenon is problematic when processing diamond, for example, for use in semiconductor devices. Traditional techniques such as annealing defect centres or ion implantation are typically accompanied by the production of a graphitic layer at the substrate surface.

Naturally mined white gemstones are graded according to a colour spread system (such as the GIA Colour Grading Scale), running from D (ice clear) to Z (a light yellowish hue). The difference in price between a "top colour" D stone and a Z of the same weight is often several orders of magnitude. For example, a flawless top D brilliant cut stone over 1 carat in weight might cost over 10000 USD retail, whereas a Z coloured diamond may only achieve a fraction of this price. Therefore, there is a significant market for gemstone enhancements and treatments.

Diamond has a fairly wide array of lattice defects which are well described in the literature, but only some of these produce colour in natural and/or artificially grown diamonds. For CVD grown diamond, the issue tends to be hydrogen-vacancy complexes. These can be a problem when growing CVD substrates for use in electronic applications as hydrogen can passivate some of the more interesting donor/acceptor states.

There are two main types of defects that dominate the colour of naturally mined and HPHT produced stones. These are:—
1. Vacancies. Some of these are quite mobile at relatively low temperatures (>700° C.) and are therefore able to be annealed out quickly at temperatures well below that at which diamond turns to graphite.
2. Nitrogen substitutions/vacancy complexes responsible for yellow colouring. These are generally far less mobile. Theoretical work and practical experiments suggest that some of these defects may be annealed out at high temperatures until the temperature is above about 1500° C., at which point most diamond surfaces start to graphitise.

It would be advantageous to provide a process which can anneal out defects from diamond at high temperatures. In naturally mined diamonds such a technique could move a diamond up the colour scale and thus increase the value to some degree. For HPHT stones, where the exclusion of nitrogen during growth is technically a lot more difficult than it is with CVD, a high temperature annealing process could potentially enable clear stones to be produced relatively cheaply.

Annealing diamond at high temperatures is not trivial. As outlined above, diamond is a metastable allotrope of carbon. This infers that it is actually unstable relative to the most stable form of carbon (i.e. graphite) and will therefore revert to graphite given the right conditions and enough time. If diamond crystals are heated beyond 800° C. in air, the surface begins to attain black patches as graphitisation occurs. At higher temperatures in air, graphitisation occurs rapidly, reducing the entire crystal to graphite in just a few minutes.

In a vacuum, graphitisation begins to occur significantly at around 1500° C. By 1800° C., graphitisation proceeds rapidly and is complete within a few minutes. It has been suggested that graphitisation can be retarded at very high temperatures (>2000° C.) in a hydrogen plasma environment, but this may be misleading as it creates chemical conditions at the diamond surface that are similar to those seen in CVD growth (i.e. the diamond may be graphitising and regrowing the diamond surface again in an equilibrium process). Thus, substantial surface graphitisation can be at risk of occurring during treatment.

Graphitisation of diamond is known to initiate more readily at crystal surfaces rather than internally. This is due to a simple tenet: graphite is less dense than diamond and, therefore, there simply is not room inside the diamond crystal for graphitic cores to form and grow without blowing open the crystal lattice. Therefore internal graphitisation is suppressed up to a point by the strength of the surrounding diamond lattice, and therefore occurs on the surface where the accompanying volume change is not as energetically constrained.

One known method for treating diamond involves placing a diamond inside a High Pressure High Temperature (HPHT) press and applying pressure and heat to mobilise defects within the diamond lattice. Such processes are thought to work to a degree by removing defects in the diamond by diffusion, and graphitisation is thought not to be an issue as the diamond is held under HPHT conditions where it is the most energetically stable allotrope. The problems with HPHT processes are largely ones of economics. Firstly, the defects that cause poor diamond colour tend not to be very mobile at high pressure conditions and that means that treatment times are relatively long. Secondly, HPHT treatments are expensive to set up and that means that only larger sizes of stones benefit.

US 2009/0110626 describes a method to improve the optical properties of diamond. The method comprises:
  (i) raising the temperature of diamond from about 1000° C. to about 2000° C. and
  (ii) controlling the pressure of the diamond to about 5 atmosphere or less outside the diamond stability field, wherein the pressure is controlled in a reducing atmosphere, and
  wherein the diamond is held within a heat-sink holder which makes thermal contact with a side surface of the diamond adjacent to the edge of the diamond.

The present invention aims to address at least some of the disadvantages of the prior art methods.

In a first aspect of the present invention there is provided a method of treating a diamond, the method comprising:

(i) providing a liquid metal saturated with carbon with respect to graphite precipitation;
(ii) lowering the temperature of the liquid metal such that the liquid metal is saturated with carbon with respect to diamond precipitation;
(iii) immersing a diamond in the liquid metal; and
(iv) removing the diamond from the metal.

Preferably, the method is a method of reducing defects in a diamond and in step (iii) the diamond is immersed in the liquid metal to reduce the defects in the diamond.

Preferably, the method is a method of improving and/or altering the optical properties of a diamond; and in step (iii) the diamond is immersed in the liquid metal to improve and/or alter the optical properties of the diamond.

In one embodiment of the present invention there is provided a method of doping diamond, the method comprising:
(i) providing a liquid metal saturated with carbon with respect to graphite precipitation;
(ii) lowering the temperature of the liquid metal such that the liquid metal is saturated with carbon with respect to diamond precipitation;
(iii) immersing a diamond in the liquid metal in the presence of a dopant to dope the diamond with the dopant; and
(iv) removing the diamond from the metal.

In another aspect of the present invention there is provided an apparatus comprising:
an open vessel for holding liquid metal;
a plunger for at least partially immersing carbon in the liquid metal;
a holder for at least partially immersing a diamond in the liquid metal;
a means of moving the plunger into the liquid metal;
a means for holding the plunger in the liquid metal; optionally a means for providing atomic hydrogen plasma and/or atomic hydrogen radicals;
a means for removing the plunger from the liquid metal;
a means of moving the holder comprising the diamond into the liquid metal;
a means for holding said holder in the liquid metal;
a means for removing the holder comprising the diamond from the liquid metal;
a means for holding the diamond out of the liquid metal whilst the diamond cools; and
a means of controlling the atmosphere of the open vessel Each aspect as defined herein may be combined with any other aspect or aspects unless clearly indicated to the contrary. In particular any feature indicated as being preferred or advantageous may be combined with any other feature or features indicated as being preferred or advantageous.

Graphitisation of a discrete diamond is a physical process which has an activation barrier. Temperature therefore affects the onset of graphitisation. Also, the addition of chemically aggressive media to the diamond tends to push the activation barrier downwards and/or to increase the rate of graphitisation in most cases. Increased pressure can also affect the rate of graphitisation, as evidenced by HPHT studies. Since graphite has a lower density compared to diamond, increased pressures subdue the rate of graphitisation. Moreover, it has been noted that a great deal of variation is seen in the rate and initiation of graphitisation on different indexed diamond surfaces.

Published studies have shown that graphitisation begins to occur on diamond at the lowest threshold temperature of 1500° C. on a (111) surface after about 45 minutes of treatment in a vacuum. Subsequent experiments at 1600° C. for 45 minutes showed graphitisation occurring in all samples in isolated patches on a (111) surface. After 1700° C., there appears to be a dramatic increase in the rate of graphitisation, with half the sample mass converting to graphite within 45 minutes. It is also reported that a subsequently cleaned (111) surface treated at this temperature shows significant signs of plastic deformation and stress. Between 1800° C. and 1900° C., complete graphitisation of the diamond was seen to occur within 5 to 10 minutes depending on the sample size, with total graphitisation occurring within 2 to 5 minutes at 2000° C. and above. Beyond 2000° C., most experiments show graphitisation proceeding at such a fast rate that practical measurements become meaningless although studies quoting rates at temperatures beyond this temperature exist.

The present inventors have found that by treating diamond in the presence of liquid metal saturated with carbon with respect to diamond precipitation it is possible to anneal the diamond at high temperatures (for example above 1500° C., or above 1600° C.) and at low pressures (for example below 133 kPa, or below 1330 kPa) to remove at least some of the defects and/or alter the colour of the diamond with substantially no graphitisation of the diamond. Thus, the present invention provides a method of improving the quality of a diamond. Preferably, during treatment of the diamond, impurities, and/or defects are removed, or reduced. Preferably the treated diamonds have an improved colour and/or optical properties compared to the properties of the untreated diamond. This preferably entails the reduction in density and/or removal of defect centres causing yellow/brown discoloration (such as N3/N2 aggregates) causing enhanced optical clarity of the stone when surveyed by eye or under a gem microscope.

As used herein the term liquid metal includes liquid, semi-liquid and/or molten metal. It also includes mixtures of more than one metal. It also includes alloys, and mixtures of more than one alloy and/or metal.

The present invention provides a method of improving the quality of diamonds, such that they can be sold at a higher price after treatment of the diamond, compared to prior to treatment.

The present method and apparatus is economically viable to run, and is cheaper than known methods of treating diamonds to improve their optical properties.

The present invention also provides a method of doping diamonds.

The method of the present invention may be used to reduce or remove extrinsic and/or intrinsic defects from diamond. The method may be used to reduce and/or remove one or more of the following defects from diamond: nitrogen (for example C-nitrogen centres, A-nitrogen centres, B-nitrogen centres, N3 nitrogen centres and N3/N2 nitrogen centres); boron; phosphorous; hydrogen; nickel and cobalt; silicon; sulphur; isolated carbon interstitials; interstitial complexes; vacancy-interstitial complexes; isolated vacancy; multivacancy complexes; dislocations; platelets; and voids.

The metal used in the present invention may comprise a single metallic element, or an alloy, or two or more metallic elements and/or alloys. Preferably, the metal is selected from lead, bismuth, tin, gold, silver, indium, gallium, antimony, nickel, cobalt, aluminium and mixtures of two or more thereof. Suitable metals also include aluminium, germanium, and mixtures of two or more thereof. Most preferably the metal is lead or an alloy containing lead. Suitable alloys include lead-gold, silver-gold, lead-tin, aluminium, -tin, and aluminium-lead alloys.

The metal preferably has a boiling point of greater than 1500° C., 1750° C., or greater than 2000° C. It is desirable for the metal to have a high boiling point so that the diamond may be heated to a high temperature without the metal undergoing significant evaporation. Significant evaporation as used herein means that less than 20%, preferably, less than 10%, more preferably less than 5% by weight of the metal evaporates during the process of the present invention based on the total weight of the metal prior to heating.

Lead has a boiling point of approximately 1750° C. The present inventors have found that diamond may be successfully annealed in lead at temperatures as low as 1250° C. However, lead may be heated up to temperatures of approximately 1600° C. without significant evaporation occurring. Preferably, the lead is heated in an argon atmosphere. Preferably a cool argon stream is passed over the surface of the liquid lead to reduce evaporation. Preferably, the argon is introduced into the reaction chamber at a temperature of from 10 to 30° C.

It has also been found that bismuth (boiling point of 1564° C.) and antimony (boiling point of 1587° C.) may also be successfully used to anneal diamonds at temperatures below their boiling point.

The metal preferably has a melting point of below 1500° C., more preferably below 1450° C., below 1000° C. or below 500° C.

Preferably the rate of dissolution of carbon in the metal should not be so high that erosion of the diamond surface occurs when immersed in a saturated solution.

Without wishing to be bound by any particular theory, it is thought that because graphitisation at high temperatures is essentially a surface phenomenon, this effect can be suppressed or reduced at high temperatures by immersing the diamond in a liquid metal that forms lower energy interfaces with diamond compared to those formed with graphitic carbons. This theory is further detailed below.

The method of the present invention may be carried out in a reaction chamber comprising an inert atmosphere. Preferably the inert atmosphere comprises a noble gas. The inert atmosphere may comprise mixtures of two or more noble gases. Preferably the inert atmosphere comprises helium and/or argon. Most preferably the inert atmosphere comprises argon.

Preferably the inert atmosphere comprises at least 90% by volume of noble gas based on the total volume of gas in the reaction chamber. More preferably, the inert atmosphere comprises at least 95%, at least 98%, at least 99%, at least 99.9% by volume of noble gas based on the total volume of gas in the reaction chamber. Most preferably the noble gas is argon.

Preferably a flow of inert gas is passed over the surface of the metal. Preferably the inert gas is introduced into the reaction chamber at a temperature in the range of from 10 to 30° C. This is advantageous as the cool gas helps to reduce the amount of evaporation from the surface of the metal.

The method of the present invention may be carried out in a vacuum. A vacuum may be used when the vapour pressure of the metal is such that evaporation from the metal surface is not significant. For example, a vacuum may be used when the metal is nickel and/or cobalt.

Preferably the reaction chamber does not comprise oxygen. The presence of oxygen in the atmosphere is thought to speed up the rate of graphitisation. The atmosphere in the reaction chamber preferably comprises less than 0.1% by volume of oxygen based on the total volume of gas in the reaction chamber. More preferably, the atmosphere comprises less than 0.05%, 0.01%, 0.001% by volume of oxygen based on the total volume of gas in the reaction chamber.

Preferably the method of the present invention is carried out at a pressure below the diamond stability field. More preferably the method of the present invention is carried out at an atmosphere in the range of from 1 kPa to 1050 kPa, from 50 kPa to 1050 kPa, more preferably from 50 kPa to 150 kPa. Preferably the pressure is below 102 kPa.

Preferably, in order to provide a liquid metal saturated with carbon with respect to graphite precipitation the metal is heated to a temperature in the range of from 1000 to 2500° C., more preferably the liquid metal is heated to a temperature in the range of from 1000 to 2000° C., from 1500 to 1750° C., from 1550 to 1750° C., or from 1550 to 1650° C.

Preferably, the temperature of the liquid metal saturated with carbon with respect to graphite precipitation is lowered by from 5 to 100° C., from 5 to 65° C. or from 5 to 50° C. such that the liquid metal is saturated with carbon with respect to diamond precipitation at the coolest part of the liquid metal. More preferably, the temperature is lowered from 20 to 60° C., more preferably still it is lowered from 30 to 50° C. such that the liquid metal is saturated with carbon with respect to diamond precipitation at the coolest part of the liquid metal.

It will be understood that the relevant phase diagram data, or the appropriate thermodynamic approximations where this data is not available, may be used to calculate when the metal is saturated carbon with respect to graphite precipitation and then when it is saturated with carbon with respect to diamond precipitation.

In the present invention the diamond is immersed, or at least partially immersed, in metal which is saturated with carbon with respect to diamond precipitation, it is not supersaturated with carbon with respect to diamond precipitation.

In the present invention, the temperature is not lowered so far that the liquid metal becomes supersaturated with respect to diamond precipitation. If this occurs, upon immersion of the diamond into the supersaturated metal, the carbon in the metal may in certain cases precipitate out onto the diamond, potentially causing the diamond to enlarge. This is not within the scope of the present invention.

U.S. Pat. No. 3,142,539 discloses the use of a molten medium heavily supersaturated with carbon with respect to diamond for forming diamonds. Such a system relies on the carbon precipitating out of the supersaturated solution onto a seed diamond resulting in growth of the diamond. There is no suggestion in this document of processing diamond in a molten medium which is other than supersaturated with carbon.

Preferably the liquid metal is at a temperature in the range of from 1000 to 2500° C. when the diamond is immersed in the liquid metal, more preferably the liquid metal is at a temperature in the range of from 900 to 2495° C., from 1000 to 2000° C., from 900 to 1995° C., from 1500 to 1750° C., from 1400 to 1745° C., from 1550 to 1750° C., from 1450 to 1745° C., from 1550 to 1650° C. or from 1450 to 1645° C. when the diamond is immersed in the liquid metal.

Preferably the liquid metal is cooled to a temperature of below 1500° C. before removing the diamond. This is because at temperatures above 1500° C. even in an inert atmosphere, there is an increased risk of graphitisation occurring on the surface of the diamond as it is removed from the metal. More preferably the liquid metal is cooled to a temperature of below 1400° C. before removing the diamond. It will be understood that the metal will still be in the liquid state when the diamond is removed.

The liquid metal may be cooled to within 150° C. above the melting point of the metal before removing the diamond. More preferably the metal may be cooled to within 100° C., 50° C. or 10° C. above the melting point of the metal before removing the diamond.

In one embodiment of the present invention the metal is not cooled prior to removal of the diamond. This embodiment may be of particular use when the temperature of the metal containing the diamond is at less than 1500° C., or less than 1400° C., or less than 1000° C. Alternatively, or additionally, this embodiment may be of particular use if the metal is to be reused to treat a further one or more diamonds before cooling.

Preferably, in order to reduce the risk of graphitisation of the diamond prior to treatment, the diamond is kept at a temperature of below 500° C., preferably below 400° C., more preferably below 300° C. This may be achieved within the reaction chamber by keeping the diamond holding structure behind refractory heat shielding within the main chamber until just before it is immersed into the metal.

When the diamond is immersed into the metal, preferably all of the diamond is immersed in the metal. This is preferred as diamond held above the surface and on the surface of the metal will tend to graphitise if at a temperature of above 1500° C.

Preferably, the diamond is immersed in and removed from the metal rapidly. Preferably the diamond is immersed in and removed from the metal at a speed of from 2 mm/s to 1 cm/s. The diamond may be immersed in and removed from the metal by means of a holder. The speed of immersion/removal of the diamond into/from the metal may be controlled by automated or mechanical means.

Preferably the liquid metal saturated with carbon with respect to graphite precipitation is provided by a method comprising:
 (a) providing a vessel;
 (b) placing a metal in a solid form in the vessel;
 (c) placing carbon in the vessel;
 (d) optionally providing an inert atmosphere in said vessel;
 (e) heating to provide liquid metal saturated with carbon with respect to graphite precipitation.

It will be understood that steps (a) to (e) may be carried out in any suitable order.

Preferably in the process of the present invention the liquid metal is heated such that a temperature gradient exists across the liquid metal. Preferably, the temperature gradient across the liquid metal is at least 10° C., more preferably it is at least 20° C., or at least 50° C.

This may be achieved by providing a single heat source to the vessel containing the metal. Preferably, the vessel is heated at its base, ensuring that the contents at the base of the vessel are hotter than the contents at the top of the vessel.

Typically the diamond is immersed into the metal just under the meniscus of the metal. Preferably, the diamond is fully immersed in the metal within 5 mm to 0.5 mm of the meniscus of the metal in the vessel when the vessel has a depth of 5 to 20 cm. By immersing the diamond in the metal towards the surface of the metal, when the vessel is heated by a heat source at the base of the vessel ensures that the metal towards the top of the vessel is saturated with carbon with respect to diamond.

Preferably during treatment of the diamond the diamond is held in the coolest region of the liquid.

Preferably the source of carbon in the metal is graphite. However, it will be understood that any other suitable source of carbonaceous material may be used. Preferably the carbonaceous material is largely graphitic in nature, for example vitreous carbon, compressed graphite, or carbon nanotubes.

Preferably the source of carbon is immersed in the metal by a plunger. The plunger may be used to hold the source of carbon towards the bottom of the vessel whilst the carbon dissolves in the metal.

The method of the present invention may be used to treat synthetic diamond and/or naturally occurring diamond.

In one embodiment of the present invention an ion-implanted diamond may be treated by annealing in liquid metal using the method of the present invention to anneal out any defects introduced into the system.

Any size of diamond may be used in the present invention. Typically the diamond will be from 0.05 ct upwards in size. However, the diamond may be from 0.01 ct upwards, from 0.05 ct upwards, or from 0.1 ct upwards in size.

Preferably the method of treating diamond as described herein, for example the method of reducing defects in a diamond, the method of improving and/or altering the optical properties of a diamond and/or the method of doping a diamond, results in substantially no change in the size of the diamond. Preferably the weight of the diamond will change by less than 10%, less than 5%, less than 2.50, and most preferably less than 1%, by weight based on the total weight of the diamond (comparing the weight of the diamond prior to treatment and after treatment). Preferably the method of the present invention is not used to substantially alter the size of the diamond. Preferably, it is not used to grow the size of the diamond.

The diamond may be polycrystalline and/or a single crystal diamond.

Preferably, the diamond used in the present invention does not have large internal inclusions or fractures. As used herein a large internal inclusion or fracture is used to mean a crack or flaw which if extended over 25% further along any one plane, could cause the diamond to fragment or become significantly structurally weaker. The presence of internal inclusions or fractures may be seen using a microscope. If large internal inclusions or fractures are present in the diamond, there is an increased risk that treatment of the diamond using the present invention will further enlarge the inclusion or fracture and may lead to the loss of part of the stone if the inclusion "blows out".

It is advantageous to ensure that contaminants, for example graphitic specks on or near the surface of the diamond are removed prior to treating the diamond in the liquid and/or molten metal. Contaminants may be anything from greases and oils picked up during handling to microscopic regions of graphite that can not be detected by the naked eye. If such contaminants are present on the diamond surface then during the treatment of the diamond in the liquid and/or molten metal graphitisation may occur around the contaminated area. Such graphitisation is still retarded in comparison to a control (i.e. a treatment process not carried out using the process of the present invention). However, if not dealt with before treatment, this graphitisation may cause serious problems at higher temperatures once it has started. Thus, graphitisation is preferably avoided. Removal of contaminants from the diamond surface is typically particularly important when natural diamonds are being treated, as these are far more likely to have graphitic pits and other such flaws or contaminants present on, or close to the surface. HPHT and single crystal CVD produced substrates generally fare much better under treatment even without pre-treatment to remove contaminants. However, pre-treatment may still be preferably used in order to remove or reduce the number of contaminants present if there are significant surface or sub-surface graphitic inclusions.

Preferably before treating the diamond in the liquid and/or molten metal, the diamond will be treated in boiling acid for from 5 to 30 minutes. More preferably the diamond will be treated in boiling acid for from 5 to 20 minutes, and most preferably for from 10 to 20 minutes. Preferably the boiling acid comprises sulphuric acid and/or nitric acid. Typically a 2:1 mixture of sulphuric acid:nitric acid (by molar concentration) is used. The acid treatment removes or reduces any impurities from the surface of the diamond.

Preferably before treating the diamond in the liquid and/or molten metal, the diamond will undergo an acid etch step. Preferably, before treating the diamond in the liquid and/or molten metal the diamond will be exposed to chromic acid. Preferably the chromic acid is formed by dissolving sodium dichromate in concentrated sulphuric acid. Preferably the diamond will be immersed in boiling chromic acid for at least 10 minutes, at least 20 minutes, at least 30 minutes. Preferably, the diamond will be immersed in boiling chromic acid for from 15 minutes to 2 hours, more preferably from 30 minutes to 1.5 hours, and most preferably for about 1 hour. Chromic acid has been found to be one of the few reagents that can etch graphite, and this type of preparation is used to strip diamonds of external graphitic features. In natural diamonds, where there are often microcracks leading to graphitic inclusions under the surface, this acid etch can sometimes remove these features and improve the outcome of the later high temperature treatment as a result. After this chromic acid step is finished, preferably the diamond is rinsed in deionised water (preferably in an ultrasonic bath and) left to dry. Most preferably, the diamond is then put into the sulphuric acid: nitric acid boil as described above.

Preferably the diamond will be exposed to an atomic hydrogen plasma and/or atomic hydrogen radicals.

Preferably the diamond will be exposed to an atomic hydrogen plasma and/or atomic hydrogen radicals before the diamond is immersed in the liquid and/or molten metal. This provides an environment in which pre-existing microscopic graphitic features on the diamond surface, and for example those which have survived the acidic etch treatment, may be removed. Preferably, this improves the outcome of the treatment and stops or reduces the possibility of homoepitaxial growth of graphite on these microscopic areas during treatment at high temperature.

Preferably, the diamond will be treating in boiling sulphuric acid and/or nitric acid, then it is treated with chromic acid, then it is exposed to an atomic hydrogen plasma and/or atomic hydrogen radicals before the diamond is immersed in the liquid and/or molten metal.

Additionally, and/or alternatively, preferably during the treatment of the diamond in the liquid and/or molten metal, the liquid and/or molten metal is exposed to atomic hydrogen plasma and/or to atomic hydrogen radicals. Preferably the atomic hydrogen plasma and/or to atomic hydrogen radical source is held just over the meniscus of the liquid and/or molten metal. Preferably, the most energetic region of radicals is held from 10 cm to 2 mm, more preferably from 7 cm to 5 mm above the meniscus. Without wishing to be bound by any particular theory, it is thought that atomic hydrogen diffuses into the liquid and/or molten metal at a high temperature and scavenges at least some, and preferably all, of any microscopic graphitic nuclei which may precipitate out during the treatment procedure and may otherwise result in the graphitic nuclei growing at the metal meniscus surface. Furthermore, exposure to atomic hydrogen plasma and/or to atomic hydrogen radicals may be continued throughout the duration of the treatment to prevent or reduce the number of graphitic particles that precipitate out during treatment coming to rest or forming on the surface of the immersed diamond. Thus, exposing the liquid and/or molten metal to atomic hydrogen plasma and/or to atomic hydrogen radicals during treatment of the diamond in the liquid and/or molten metal typically leads to improved and more reliable results (particularly at high temperatures). For example, more defects in the diamond are removed, and/or the optical properties of the diamond are improved over and above when the process is carried out in the absence of atomic hydrogen plasma and/or to atomic hydrogen radicals.

Preferably the flux of atomic hydrogen plasma and/or to atomic hydrogen radicals used is greater than $1 \times 10^{15}$ atoms per $cm^2$ per second at the metal meniscus. More preferably it is greater than $1 \times 10^{15}$ atoms per $cm^2$ per second at the metal meniscus.

Preferably the atomic hydrogen plasma and/or atomic hydrogen radicals are generated by a microwave, hot filament, arc jet or a flame method. Such methods are known in the art. Any other suitable methods of providing the atomic hydrogen plasma and/or atomic hydrogen radicals may be used. Preferably, the source of atomic hydrogen plasma and/or atomic hydrogen radicals is held over the liquid and/or molten metal during treatment of the diamond. Preferably the plasma or radical source used in the present invention comprises only hydrogen atoms and no other atoms.

Typically, the hydrogen plasma and/or atomic hydrogen radicals is generated using a "remote plasma source" which runs at about 400 W, creating a small (approximately 5 cm diameter) plume of plasma above the meniscus of the metal. Thus, a low power is used, running at a density of approximately 5-20 W/$cm^3$. Use of differential pumping allows the chamber pressure to run at about 80 kPa of hydrogen, in the form of "cracked" hydrogen gas (i.e. monatomic hydrogen radicals) and reformed hydrogen gas. Argon only may be used during the initial flush through of the chamber before pumping down to high vacuum initially, and at the end of the treatment process when the chamber is brought back up to pressure in order to open up the chamber.

In order to access the improvement in colour in the diamond using the present invention, prior to treatment the colour of the diamond may be noted against a reference sample. This technique will be familiar to a practioner of the art.

The diamond is then preferably set into a holder which allows the diamond to be immersed and removed from the liquid metal.

After treatment of the diamond using the method of the present invention, the diamond is preferably again placed in boiling acid. Preferably the diamond will be treated in boiling acid for from 5 to 30 minutes. More preferably the diamond will be treated in boiling acid for from 5 to 20 minutes, and most preferably for about 10 minutes. Preferably the boiling acid comprises sulphuric acid and/or nitric acid. Typically a 2:1 mixture of sulphuric acid:nitric acid (by molar concentration) is used. The acid treatment removes or reduces any impurities from the surface of the treated diamond.

After treatment the colour of the diamond may be noted against the reference sample, and any changes in appearance may be noted.

Electron paramagnetic resonance (EPR) and Raman Infrared (IR) spectra studies may also be used to determine the changes which have occurred in the diamond. Methods of using Electron paramagnetic resonance (EPR) and Raman Infrared (IR) spectra studies to study diamonds are well known in the art. Changes in the Raman IR spectra may be used to determine the precise nature of defects that have been annealed and/or altered by the treatment. Photomicrographs, and/or High Resolution Transmission Electron Microscopy may also be used to analyse the changes in the diamonds structure.

Preferably when the diamond is immersed in the metal, the diamond is annealed. Annealing of the diamond immersed in the liquid metal removes at least some of the defects and/or alters the colour of the diamond. The presence of the surrounding metal allows annealing to be carried out at much higher temperatures than would be possible in, for example, a vacuum, whilst minimising graphitisation of the diamond.

The diamond may be immersed in the metal for from 1 minute to 10 hours, from 10 minutes to 3 hours, or from 30 minutes to 1 hour. It will be understood that the length of time may be varied, depending on the reactions conditions, and the desired result. Preferably the diamond is not held in the metal for a sufficient length of time for substantial dissolution or deposition of undesirable surface artefacts to occur.

Preferably, after treatment of the present invention no graphitisation of the diamond has occurred. More preferably, less than 10% by weight, less than 5% by weight, less than 2% by weight, less than 1% by weight or less than 0.5% by weight of the diamond has graphitised during the treatment, based on the original total weight of the diamond.

Graphitisation of the diamond may be measured by measuring the mass of the diamond, boiling it in concentrated chromic acid for up to 1 hour, then washing the stone in deionised water (preferably in an ultrasonic bath), and finally reweighing it to determine the amount of graphite removed. This technique is familiar to a skilled practitioner of the art.

In one embodiment of the present invention lead is heated to a temperature in the range of from 1600° C. to 1700° C. in the presence of graphite to provide liquid lead saturated with carbon with respect to graphite precipitation. The lead is then cooled by approximately 50° C. to provide liquid lead saturated with carbon with respect to diamond precipitation. A diamond is then immersed in the lead for approximately 30 minutes in order to anneal the diamond. The diamond is then removed.

Without wishing to be bound by any particular theory, the present inventors have hypothesised that the reason that the metal of the present invention allows diamond to be annealed at high temperatures whilst not causing, or causing minimal, graphitisation at the diamond's surface is related to the wettability of diamond and graphite by the liquid metals.

Wetting angles of liquids on solids are directly related to the surface energy of the interface formed. Thus, the present inventors have realised that the difference between the wetting angles seen between diamond and graphite in a metal system has several important implications. These are:—

- If the liquid metal forms a lower energy interface with a range of diamond surfaces than with a range of graphite surfaces then a diamond surface is more energetically stable when immersed in such a fluid than a graphite surface.
- Assuming that graphitisation of diamond occurs primarily at the diamond surface, this phenomenon could be energetically suppressed in a diamond immersed in a fluid obeying the criterion above at high temperatures.

The term "wetting angle" is well known to the skilled person. The creation of an interface between a liquid and a solid phase results in a change in the free energy of the system. In sessile drop experiments, a droplet of liquid may be dropped onto a planar solid surface held under vacuum. The angle that the droplet meniscus forms with the solid surface can be measured photographically and this is formally termed the wetting angle θ.

The wetting angle can be used to determine the energy change required to form the interface via the classical relation: —

$$\cos\theta = \frac{\sigma_{SV} - \sigma_{SL}}{\sigma_{LV}} \quad (1)$$

where θ is the wetting angle, $\sigma_{SV}$ the interfacial energy between the solid surface S and the vapour surround V, $\sigma_{SL}$ the interfacial energy between the solid surface S and the liquid droplet L, and $\sigma_{LV}$ the interfacial energy between the droplet and surrounding vapour phase. The term "interfacial energy" as used herein refers to the specific free energy of the surface. This equation assumes θ to be an equilibrium value, and that the surfaces involved are planar (i.e. atomically smooth), homogenous and are inert with respect to the sessile drop. $W_a$ (the work of adhesion) are defined as the energy change during the creation of the new interface. In the case of sessile drop experiments, this refers to the creation of the solid-liquid interface and is written:—

$$W_a = \sigma_{SV} + \sigma_{LV} - \sigma_{SL} \quad (2)$$

This can be combined with the Young equation (1) to give a relationship between the work of adhesion and the wetting angle known as the Young-Dupré equation:—

$$W_a = \sigma_{LV}(\cos\theta + 1) \quad (3)$$

Since there is a large body of existing $\sigma_{LV}$ data for metal melts in a vacuum, it is possible to calculate $W_a$ values from wetting data obtained at various temperatures using the following formula:—

$$\sigma_{LV}(T) = \sigma_{LV}(T_F) + \sigma'_{LV}[T-T_F] \quad (4)$$

Where $\sigma'_{LV}$ is an experimentally measured value of $d\sigma_{LV}/dT$ and $T_F$ is the melting point of the metal (N.B. all temperatures are measured in Kelvin). Since equation (3) dictates a maximum work of adhesion value of $2\sigma_{LV}$ for a given system, it is possible to plot this maximum against temperature as a reference on any graphical analysis of wetting data.

The Table below shows sessile drop studies of some Group IIIA to VA elements and their alloys on diamond and graphite.

| Metal/Alloy | Temp (° C.) | Diamond θ | $W_a$ (mJm$^{-2}$) | Graphite θ | $W_a$ (mJm$^{-2}$) |
|---|---|---|---|---|---|
| Al | 800 | 150 | 113 | 157 | 67 |
| Ge | 1000 | 109 | 390 | 146 | 100 |
|  | 1000 | 136 | 163 | 139 | 142 |
| Ge + 2.6% Al | 1255 | 56 | 860 | 131* | 190 |
| Sn | 1000 | 127 | 190 | 149 | 70 |
|  | 1000 | 125 | 207 | 149 | 69 |
|  | 1100 | 125 | 202 | 150 | 64 |
| Pb | 1000 | 108 | 265 | 144 | 75 |
| Sb | 1000 | 119 | 180 | 141 | 80 |
|  | 900 | 120 | 178 | 140 | 83 |

Table showing selected data from sessile drop studies of elements and their alloys on diamond and graphite.

All of the metals shown in the table above have lower energy interfaces with diamond than with graphite (i.e. wet the surface better).

Preferably, the metal used in the present invention forms lower energy interfaces on diamond surfaces than it does on graphitic surfaces. Interfacial energies can then either be extrapolated from wetting data and theoretical assumptions on the nature of diamond and graphite surfaces, or determined experimentally where possible.

Preferably the metal used in the present invention does not react with carbon to form a stable carbide. If this occurs, there is an increased likelihood that the diamond will be destroyed upon immersion.

In one aspect of the present invention there is provided a method of doping diamond, the method comprising:
(i) providing a liquid metal saturated with carbon with respect to graphite precipitation;
(ii) lowering the temperature of the liquid metal such that the liquid metal is saturated with carbon with respect to diamond precipitation;
(iii) immersing a diamond in the liquid metal in the presence of a dopant to dope the diamond with the dopant; and
(iv) removing the diamond from the metal.

The preferred features of the present invention described in relation to improving the optical properties of diamond and/or reducing defects in diamond are equally applicable to the method of doping diamond as described herein.

The dopant may be selected from boron, phosphorus, sulphur, lithium, aluminium and mixtures of two or more thereof.

The dopant may be provided in the liquid metal prior to diamond immersion.

The dopant may be coated or painted onto the surface of the diamond. Upon immersion and annealing of the diamond in the liquid metal the dopant diffuses into the diamond lattice.

The method of doping diamond as herein described is of particular use for doping diamonds with large dopant atoms such as phosphorus and sulphur. Dopant atoms of this size are too large to be incorporated easily during growth of the diamond, and are often too destructive to be reliably used in ion implantation. Prior art attempts at anneal ion implantation using most dopants are inevitably hampered by the progressive graphitisation of surface layers. The present process provides a process which allows high temperatures to be used to anneal and dope the diamond, whilst minimising graphitisation of the diamond. This can be achieved by immersing the diamond into a liquid metal forming lower energy interfaces with diamond compared to those formed with graphite.

In another aspect of the present invention there is provided an apparatus comprising:
an open vessel for holding liquid metal;
a plunger for at least partially immersing carbon in the liquid metal;
a holder for at least partially immersing the diamond in the liquid metal;
a means of moving the plunger into the liquid metal;
a means for holding the plunger in the liquid metal;
a means for removing the plunger from the liquid metal;
optionally a means for providing atomic hydrogen plasma and/or atomic hydrogen radicals;
a means of moving the holder comprising the diamond into the liquid metal;
a means for holding said holder in the liquid metal;
a means for removing the holder comprising the diamond from the liquid metal;
a means for holding the diamond out of the liquid metal whilst the diamond cools; and
a means of controlling the atmosphere of the open vessel.

The vessel, the holder for at least partially immersing the diamond in the metal and the plunger for at least partially immersing carbon in the liquid are made from suitable materials such that they can withstand high temperatures (which are often above 1500° C.) and the harsh reaction conditions.

Figure 5:
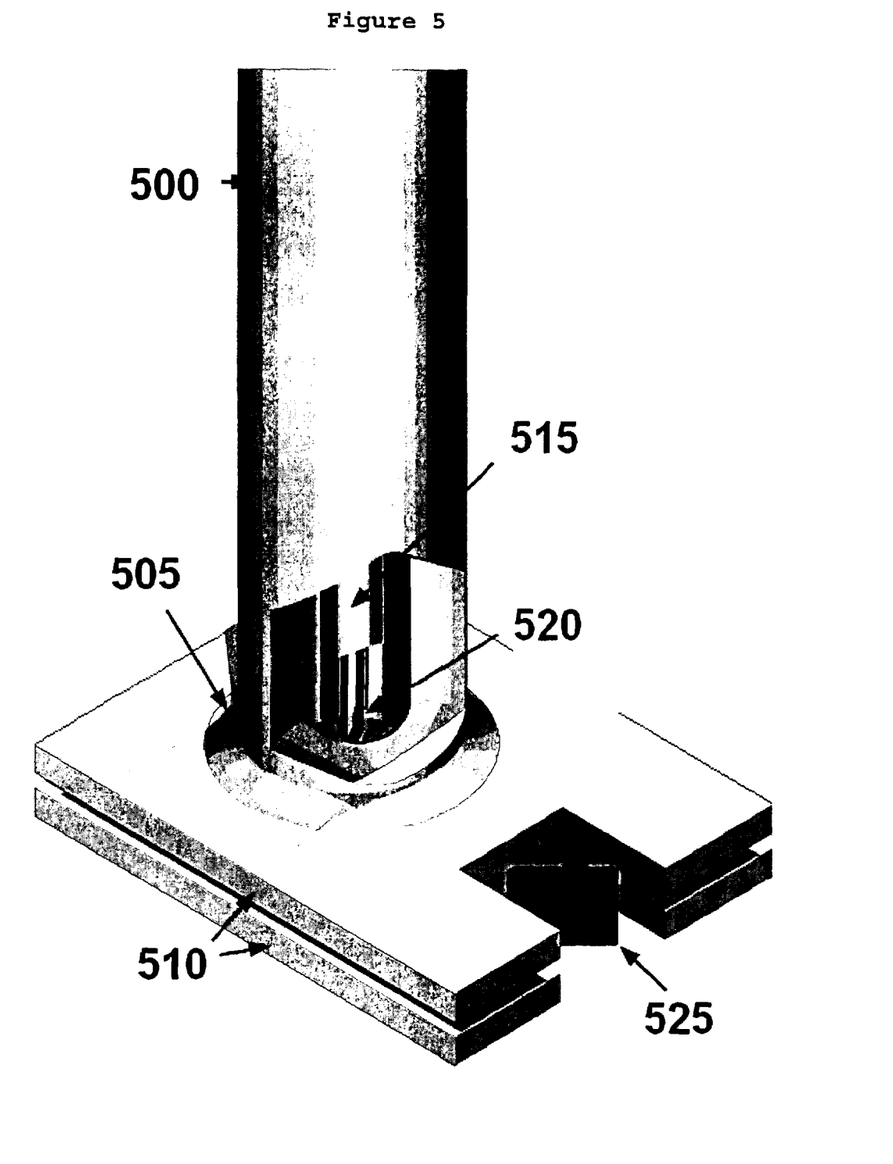
FIG. 5: shows a cutaway diagram of the ceramic diamond holder showing integral features.
Figure 6:
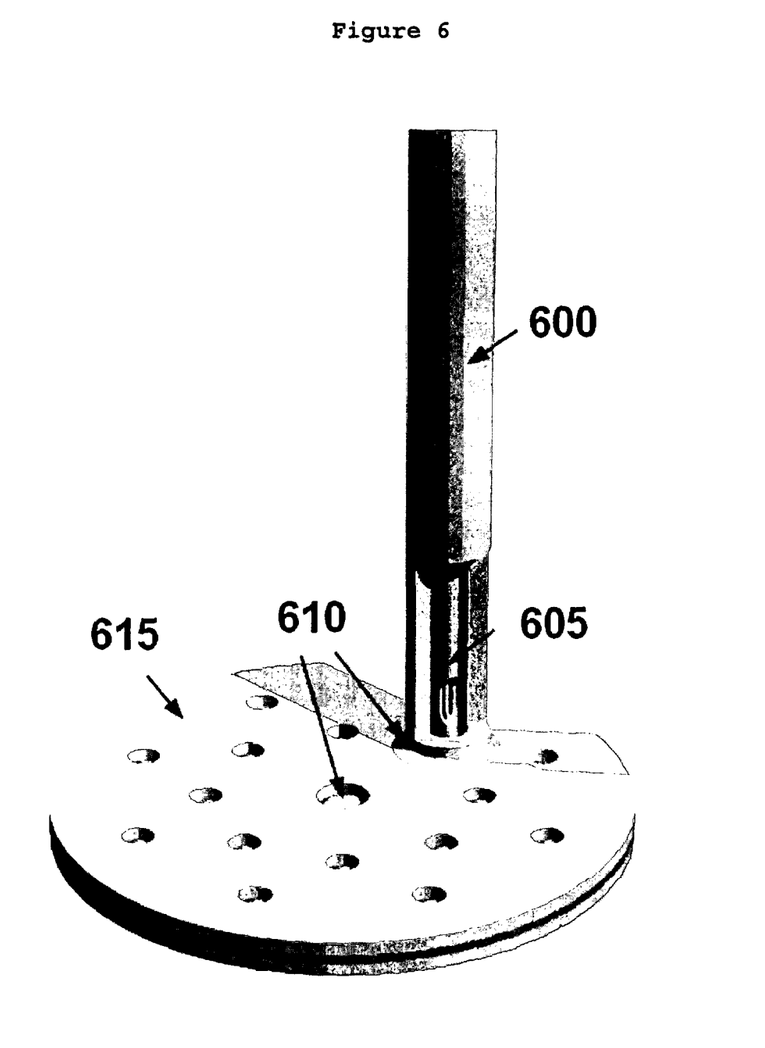
FIG. 6: shows a cutaway diagram of the ceramic plunger showing integral features.

The plunger and holder need to be made of material which is resistant to thermal shock at high temperatures. Boron nitride has been found to be a suitable material. However, it is expensive, and may be difficult to form into the complex structures required for the diamond holder. The present inventors found that suitable plungers and holders may be made by coating high temperature alumina parts with thermal shock resistant alumina cement. An example of a diamond holder is shown in FIG. 5. An example of a plunger is shown in FIG. 6.

The present inventors have found that standard crucibles constructed from either high purity alumina, zirconia, yttria stabilised zirconia, chrome-alumina, boron nitride, titanium diboride, or other ceramics resistant to temperatures of up to 1800° C. are advantageous for use as containing vessels for the liquid metal. Preferably the crucible has a tapered wall construction to allow easy removal of the solidified metal slug after use. Preferably the crucible is constructed from a material that is not wet by the molten metal.

Preferably the apparatus comprises a means for providing atomic hydrogen plasma and/or atomic hydrogen radicals.

The present invention will now be described further, by way of example only, with reference to the following drawings, in which.

Figure 1:
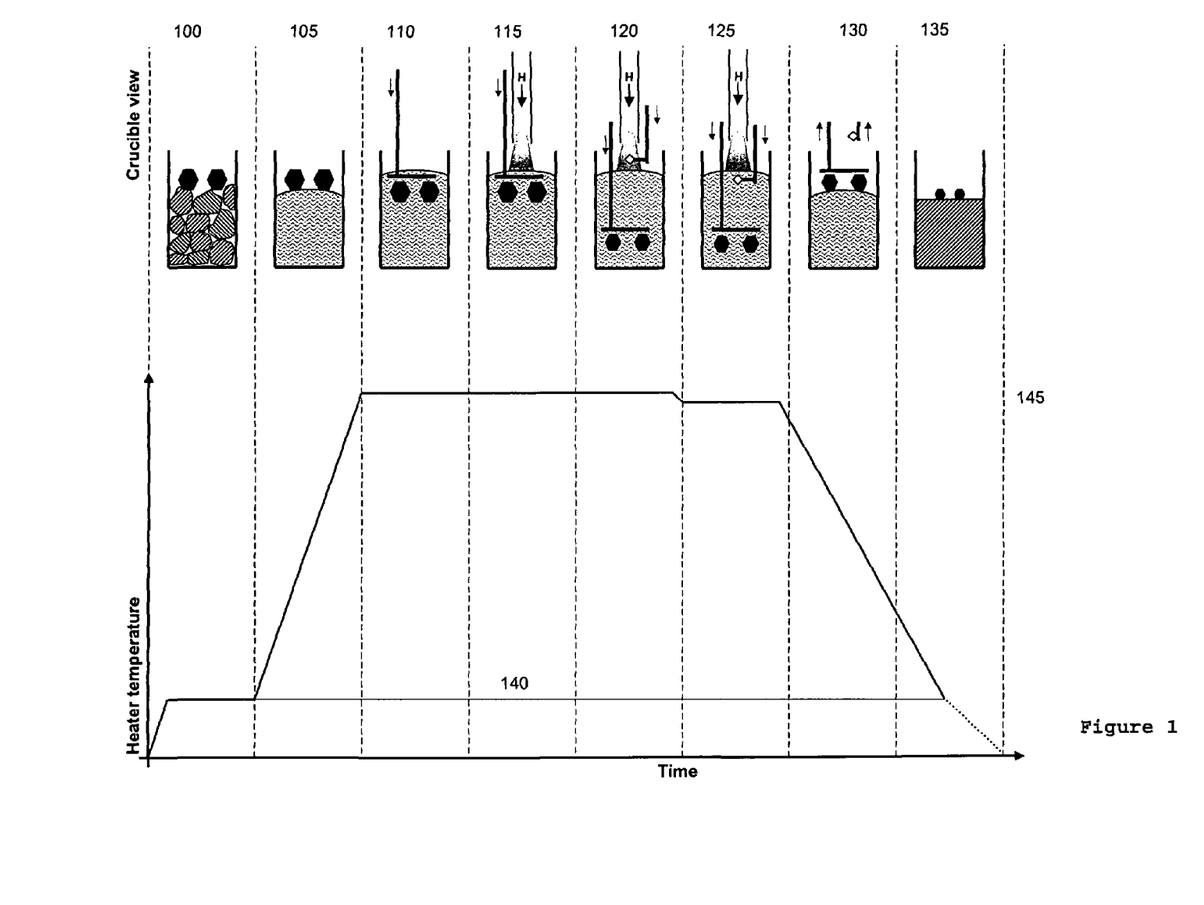
FIG. 1: shows a simplified diagram showing a typical temperature profile of the heating element during a diamond treatment run using atomic hydrogen radicals before and during the immersion of the diamond into the stabilising fluid. The crucible view shows typical relative positions of the plunger, diamond holder, and plasma source during each stage, with graphite blocks shown in black and the metal shown in diagonal lines (solid) or wavy lines (liquid).
Figure 2:
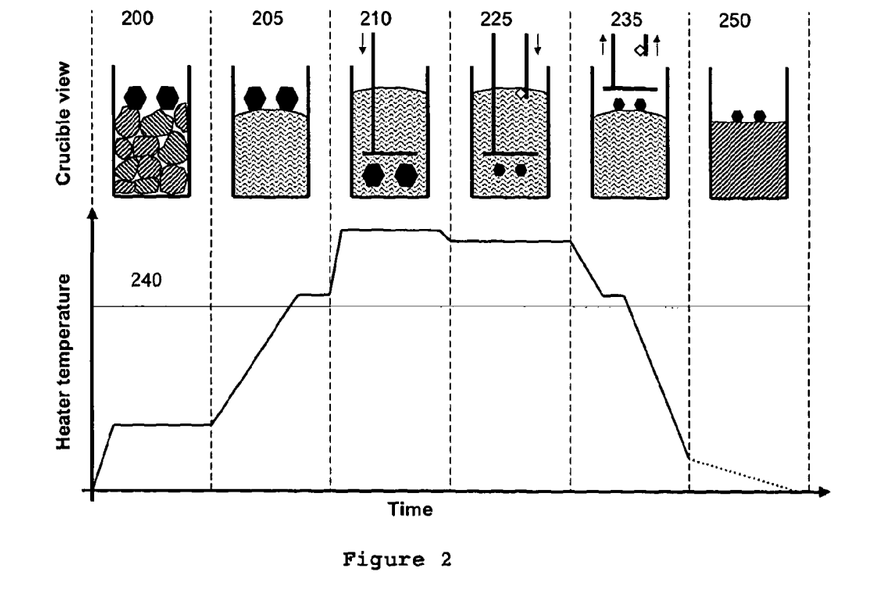
FIG. 2: shows a simplified diagram showing a typical temperature profile of the heating element during a diamond treatment run without the presence of a hydrogen radical and/or plasma source. The crucible view shows typical relative positions of the plunger and diamond holder during each stage, with graphite blocks shown in black and the metal shown in diagonal lines (solid) or wavy lines (liquid).
Figure 3:
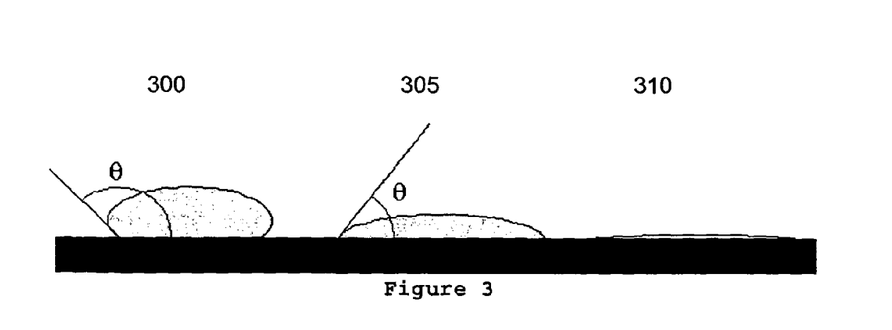
FIG. 3: shows a simplified description of different wetting behaviours of fluids on solid surfaces.

Key for FIG. 1 which shows a plot of Heater Temperature against Time, with Crucible view.
100 Outgassing
105 Melting
110 Dissolving
115 Plasma Start
120 Etching
125 Immersion
130 Removal
135 Cooling
140 Melting Point
145 Diamond treatment process using hydrogen Key for FIG. 2 which shows a plot of Heater Temperature against Time, with Crucible view
200 Outgassing
205 Melting
210 Dissolving
225 Immersion
235 Cooling
240 Melting Point
250 Shutdown Key for FIG. 3
300 (a) Non-wetting $\theta > 90°$ 305 (*b*) Wetting θ<90°
310 (*c*) Perfect wetting θ≈0°
  Key for FIG. 5
500 6.35 mm OD high purity alumina tube
505 High strength alumina cement
510 Laser cut high purity alumina plates
515 Alumina thermocouple sleeve
520 Type C thermocouple
525 Diamond
  Key for FIG. 6
600 6.35 mm OD high purity alumina tube
605 Alumina thermocouple assembly
610 High strength alumina cement
615 Laser cut alumina discs FIG. 1 shows a typical diamond treatment with the addition of an ambient hydrogen plasma etching step prior to the immersion of the diamond into the stabilising fluid, and the maintenance of the plasma hydrogen source for the duration of the treatment. The solid metal (shown by diagonal lines) and graphite blocks (shown by solid black colouring) is placed in a crucible at time zero. The crucible is then heated above the melting point of the metal to provide liquid metal (shown by a wavy line) and graphite. The graphite is preferably pushed just under the meniscus of the liquid by means of a plunger. A hydrogen plasma is then held directly over the meniscus using either a remote plasma source, a microwave generator, DC arc jet, or other means. The plunger holds the graphite in the liquid metal whilst the carbon at least partially dissolves in the metal to provide metal saturated with carbon with respect to graphite and a low concentration of atomic hydrogen. The plunger gradually moves the graphite blocks down through the liquid, preferably to hottest part of the liquid at the bottom of the crucible. The temperature of the metal is then lowered until the liquid metal is saturated with carbon with respect to diamond. The diamond which is attached to or held on a holder is then lowered and rotated into position just inside the plasma plume for up to 10 minutes in order to etch off any microscopic graphitic surface features. The diamond is then immersed into the liquid metal. The diamond is held in the metal for a sufficient length of time for it to be annealed. Annealing of the diamond results in at least some of the defects being removed from the diamond, and/or the colour of the diamond to be altered. The hydrogen plasma is maintained above the meniscus at a low concentration throughout this period. The metal is then cooled to a temperature still above the melting point of the metal, but preferably below 1500° C. The holder comprising the diamond is then removed from the metal slowly and into the plasma plume. The diamond and holder are then moved out of the plasma and up into the top section of the chamber. The plasma is turned off and the apparatus is left to cool to room temperature. It will be understood that it is not necessary to cool the metal to room temperature after the treatment of each diamond, or to turn the plasma on or off. Instead, the liquid metal may be used to treat a number of diamonds either sequentially or simultaneously.

FIG. 2 shows a typical diamond treatment without the use of hydrogen plasma in the system. The solid metal (shown by diagonal lines) and graphite blocks (shown by solid black colouring) is placed in a crucible at time zero. The crucible is then heated above the melting point of the metal to provide liquid metal (shown by a wavy line) and graphite. The graphite is preferably pushed towards the bottom of the crucible by means of a plunger. The plunger holds the graphite in the liquid metal whilst the carbon at least partially dissolves in the metal to provide metal saturated with carbon with respect to graphite. The temperature of the metal is then lowered until the liquid metal is saturated with carbon with respect to diamond. The diamond which is attached to or held on a holder is then immersed into the liquid metal. The diamond is held in the metal for a sufficient length of time for it to be annealed. Annealing of the diamond results in at least some of the defects being removed from the diamond, and/or the colour of the diamond to be altered. The metal is then cooled to a temperature still above the melting point of the metal, but preferably below 1500° C. The holder comprising the diamond is then removed from the metal, and the apparatus is left to cool to room temperature. It will be understood that it is not necessary to cool the metal to room temperature after the treatment of each diamond. Instead, the liquid metal may be used to treat a number of diamonds either sequentially or simultaneously.

Figure 4:
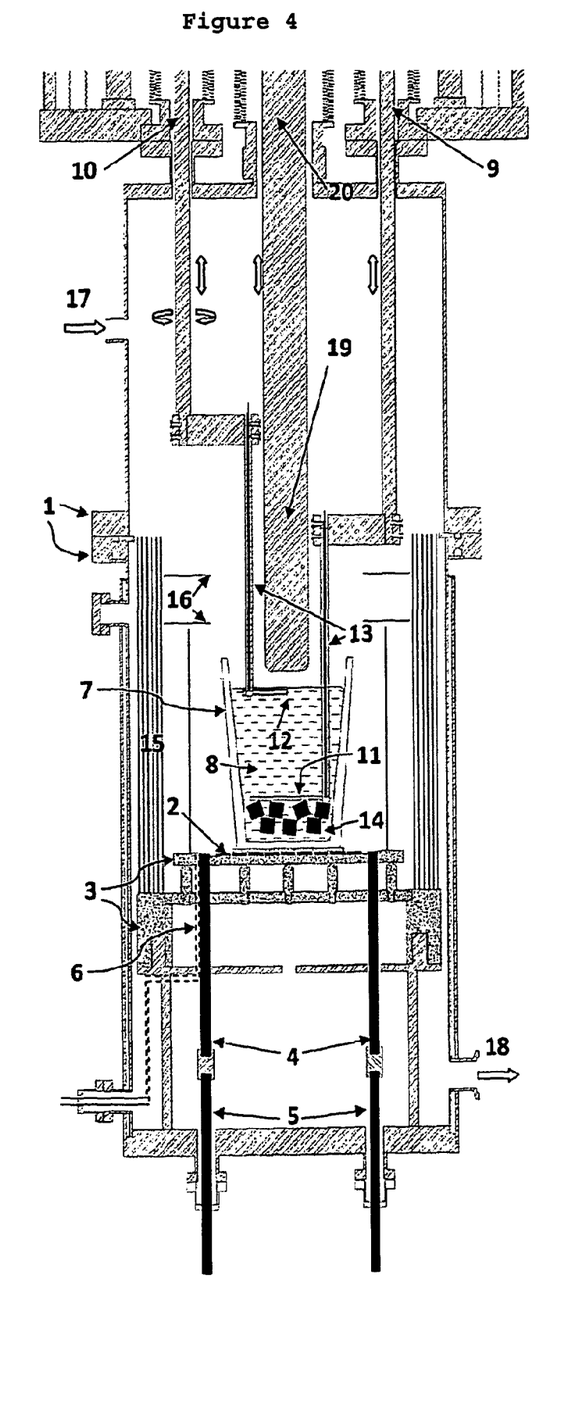
FIG. 4: shows a schematic diagram of basic apparatus for performing the described process.

A basic apparatus suitable for performing the described process is shown in FIG. 4. A standard water cooled vacuum chamber (1) is used to contain a high temperature heating element (2) based on a supporting stage structure comprised of materials resistant to the high temperatures encountered (3). This can be constructed from a high temperature ceramic material or suitably coated graphite if preferred. Power is delivered to the heating element using conductive parts (4) coupled to power feedthroughs that run to the outside of the chamber (5). A high temperature thermocouple (6) is used to provide feedback control to the power delivery source. In another embodiment of the invention, a non-contact temperature sensor, such as an infrared pyrometer may be used to provide feedback control to the power delivery source. A crucible (7) is placed above the heating element in order to contain the molten metal or alloy used in the process (8). Ideally the crucible should have tapered walls in order to facilitate the removal of the solidified metal or alloy, allowing repeated use of the apparatus with different metal or alloy systems. The crucible preferably is of an appropriate height to ensure at least a 50° C. temperature gradient between the bottom and top of the molten material.

Linear and rotary manipulators mounted on the top of the chamber (9) (10) are used to move a plunger (11) and diamond holder (12) in and out of the molten material in the crucible.

Both plunger and wafer are preferably constructed from high temperature refractory materials that are inert to carbon and the molten material in the crucible. The plunger and diamond holder assemblies are composed of hollow tube structures with thermocouples positioned internally (13) to allow collection of temperature data at the extremities of each part during the experiment. These are connected to feedthroughs leading out the top of the chamber (not shown). If constructed from refractory ceramics, the plunger and diamond holder assemblies are coated with a thin application of cured ceramic cement in order to resist the high thermal shock conditions endured as these parts are moved in and out of the molten material. The plunger is used to push graphite pieces (14) into the hottest part of the material in the crucible once it has melted. Enough graphite must be used to ensure an excess is available in order to guarantee saturation of the molten material with carbon. The minimum amount of graphite needed is calculated from phase equilibrium data available widely in the literature.

In the preferred embodiment of the invention shown, a remote plasma source (19) is used to create a hydrogen plasma above the meniscus of the metal. The source and resulting plasma plume can be raised or lowered into place above the meniscus using a single axis linear manipulator (20) similar to that used to move the plunger in and out of the stabilising liquid. Pure hydrogen gas is fed into the plasma generator by a leak valve or mass flow controller (not shown) and is used to both etch and remove any microscopic graphitic areas on the diamond surface prior to immersion in the stabilising fluid. The plasma is kept ignited throughout the treatment process and held above the fluid meniscus in order to etch away any graphitic nuclei that may form on or near the meniscus as the treatment duration lengthens. On final removal from the fluid, the diamond can be held in the plasma for a short duration in order to again etch away any errant material or surface slag that can become stuck to the surface during removal. In other embodiments of the invention, a DC arc jet can be used with the added benefit of being able to easily strike a plasma above the meniscus at much higher pressures (i.e. >50 kPa) than for differentially pumped remote plasma sources. In yet another embodiment of the invention, a standard 2.45 GHz microwave generator mounted directly above the crucible can be used to produce hydrogen plasma over the meniscus of the liquid metal. In a further embodiment of the invention, the hydrogen plasma is produced by passing hydrogen gas over a hot filament structure again positioned above the fluid meniscus.

The hot zone of the apparatus surrounding the heating element is surrounded with concentric heat shielding (15) constructed of refractory materials capable of withstanding the high temperatures involved. Further heat shields above the hot zone (16) are used to provide a refuge area for the diamond holding structure (12) during the ramping of the crucible and its contents to high temperature. Input of cool inert gas at the top of the apparatus (17) and subsequent removal at the bottom of the apparatus (18) ensures a degree of cool flow over the diamond during the run to high temperature, ensuring the temperature remains below 400° C. until the diamond is ready to be treated. This flow is regulated using a throttling valve connected at (18) to maintain a set pressure during operation. In embodiments of the invention where hydrogen plasma is not used, this background pressure of inert gas is kept close to ambient in order to minimise evaporation from the surface of the molten material in the crucible. In embodiments of the invention using hydrogen plasma, the inert gas feed used to cool the diamond is replaced by a pure hydrogen feed, which can fed into the chamber to maintain background pressure if needed. A further gated high vacuum pump connected to the chamber front (not shown) allows it to be evacuated to a pressure of <0.001 Pa during the initial part of the process, ensuring oxygen and other reactive gases adverse to the treatment process are completely removed from the system. Precise control over conditions within the system is configured using a supervisory software and hardware system in a manner familiar to a skilled practitioner of the art.

The present invention will be further illustrated with reference to the following non-limiting Examples.

EXAMPLE 1

The following example illustrates the treatment of a natural diamond using the process to anneal defects within the stone. The end result is a reduction in the intensity of yellow colouring in the stone that increases its graded colour value according to industry standard grading systems such as the GIA Colour Grading Scale.

The diamond selected for treatment is firstly boiled for 10 minutes in an excess of sulphuric and nitric acids to remove any surface impurities. It is then washed in distilled water in an ultrasonic bath and left to dry. The diamond is weighed at 0.017 g. The diamond is then examined under a microscope and photographed under controlled illumination conditions together with a similarly coloured reference stone. Generally, natural or synthetically produced stones of GIA grade L to Z can be used to demonstrate the annealing action of the process. In this case, a diamond of GIA colour V (Light Yellow) is selected. Next, the diamond is place carefully in between the ceramic plates of the diamond holder, and a small amount of high temperature alumina ceramic paste is used to cement these parts together, preferably holding the diamond in a manner that ensures the bare minimum of contact with the holder. The holder is then set in place in the main chamber. At this point, the diamond holder is fully retracted and shielded from the main hot zone of the furnace by several layers of heat shielding. 3 kg of highly pure (99.999+%) lead metal is then added into a high purity alumina crucible. Along with this, three pure (99.9999+%) graphite blocks weighing >17 g each are added to ensure a large excess is present during dissolution. The crucible is placed on the heater stage and the chamber sealed.

The chamber is first evacuated to high vacuum (below 0.001 Pa) pressure using the attached high vacuum pump and flushed with high purity, $O_2$ and $H_2O$ gettered argon. Power is then applied to the heating element and the system left to equilibrate and outgas at 300° C. After 1 hour, the system is then flushed with argon 2 more times. The pressure is then maintained at 80 kPa to 87 kPa of argon with a flow rate of 200 sccm by software control of a throttling valve, mass flow controller, and roughing vacuum pump. Now power is applied carefully to the heater to raise the temperature of the element to above 1650° C. Once the material has melted in the crucible, the plunger is operated and used to push the graphite blocks to the bottom where they remain for the duration of the treatment. When the heater program reaches peak temperature, it is held there for 15 minutes to ensure the graphite dissolves to an equilibrium level at the hottest point in the cycle. The heater power is then reduced to 50° C. below peak and left until the temperature reading at the bottom of the melt equalises. The diamond holder is then rapidly moved from behind the heat shield and immersed into the top of the molten material where it is held for a minimum of 10 minutes at a temperature greater than 1500° C.

At this stage either:—
1) The power applied to the heater is then gently lowered so that the internal temperature of the molten lead registers 400° C. at the plunger. The diamond holder assembly is then removed, and placed behind the heat shielding. The plunger holding the graphite blocks at the bottom of the crucible is also withdrawn to the starting position.

Or:—
2) The power applied to the heater is then lowered gently until the molten lead registers 1400° C. at the plunger. The diamond holder assembly is then removed, and placed behind the heat shielding. The heater power is then gently ramped down until the temperature at the plunger registers 400° C. The plunger is then withdrawn from the crucible to the starting position.

The apparatus is left to cool, brought up to atmospheric pressure and the diamond holder removed. Once removed from the holder, the diamond is again boiled for 10 minutes in nitric and sulphuric acids to remove any surface contamination then examined under a microscope. The diamond is then compared to the reference stone and a standard GIA colour grading chart and found to be colour O. The diamond is then reweighed and found to weigh 0.017 g as before, indicating that no significant mass change had occurred. Importantly, no surface degradation due to graphitisation or dissolution is observed.

EXAMPLE 2

The technique described in example 1 is performed, using a polished HPHT produced diamond displaying primarily (111) and (100) surfaces that is graded Fancy Light Yellow on the GIA grading scale. The diamond is first boiled for 10 minutes in an excess of a 2:1 ratio mix of concentrated sulphuric and nitric acids. It is then washed in distilled water in an ultrasonic bath and left to dry. The diamond is then examined under a microscope and photographed under controlled illumination conditions together with a similarly coloured reference stone. The diamond is weighed at 0.026 g. The diamond is placed carefully in between the ceramic plates of the diamond holder, and small amount of high temperature alumina ceramic paste is used to cement these parts together, preferably holding the diamond in a manner that ensures the bare minimum of contact with the holder. The holder is then set in place in the main chamber. At this point, the diamond holder is fully retracted shielded from the main hot zone of the furnace by several layers of heat shielding. 3 kg of high purity (99.999+%) lead is added to a high purity alumina crucible. Along with this, three pure (99.9999+%) graphite blocks weighing >17 g each are added to ensure a large excess is present during dissolution. The crucible is placed on the heater stage and the chamber sealed.

The process then continues in an identical manner to that described in Example 1. In this case however, the diamond is immersed into the molten lead for 1 hour rather than the ten minutes described in Example 1.

When the diamond is recovered at the end of the experiment, it is then boiled in an excess of concentrated nitric and sulphuric acids to remove surface debris. It is then washed in distilled water in an ultrasonic bath and left to dry. The diamond is then examined under a microscope and photographed under controlled illumination conditions together with a similarly coloured reference stone. The diamond is weighed again and found to weigh at 0.026 g, having lost no discernable mass. The diamond is now judged to be colour P to Q on the GIA grading scale. Furthermore, no visible erosion and/or graphitisation is discernable on any of the polished surfaces.

EXAMPLE 3

In this example, a clear natural diamond is doped using boron placed alongside the diamond immersed in the molten material at high temperature.

A clear single crystal CVD grown diamond fragment is taken and boiled in a 2:1 mixture of concentrated sulphuric and nitric acids for 10 minutes. The diamond is then washed in distilled water in an ultrasonic bath and left to dry. The diamond is then weighed at 0.021 g. The diamond is then examined under a microscope and photographed under controlled illumination conditions together with a similar reference piece. It is preferable that this is either a fragment of the same diamond or a diamond grown under identical conditions. In this case, the diamond is noted to be essentially colourless on the GIA scale (D to G rating). A piece of 3 mm thick 99.6% pure elemental boron is cut to size, washed in acetone, then distilled water and left to dry. This is then placed in the ceramic diamond holder directly alongside but not directly touching the diamond to be doped as in Example 1 and cemented in place using high temperature alumina ceramic paste. Preferably this is done in such a way that the maximum possible surface area of the diamond is then exposed to the molten material during the subsequent processing steps.

The holder is then set in place in the main chamber. At this point, the diamond holder is fully retracted shielded from the main hot zone of the furnace by several layers of heat shielding. 2.1 kg of pure (99.99%) tin metal is then added into a high purity alumina crucible. Along with this, three pure (99.9999+%) graphite blocks weighing >17 g each are added to ensure a large excess is present during any dissolution. The crucible is placed on the heater stage and the chamber sealed.

The process then continues in an identical manner to that described in Example 1. In this case however, the diamond is immersed into the molten tin for 15 minutes at 1500 C rather than the ten minutes described in Example 1.

The diamond is recovered at the end of the experiment. It is then boiled in an excess of concentrated nitric and sulphuric acids to remove surface debris. It is then boiled with an excess of chromic acid prepared in concentrated sulphuric acid for 1 hour. Finally the diamond is then washed in distilled water in an ultrasonic bath and left to dry. The diamond is then examined under a microscope and photographed under controlled illumination conditions and found to have taken on a slight blue hue. The diamond is weighed again and found to weigh at 0.020 g, having lost 1 mg in mass due to surface erosion where boron carbide formation has occurred.

EXAMPLE 4

The following example illustrates the treatment of a rough natural diamond using the process to anneal defects within the stone. The end result is a reduction in the intensity of yellow colouring in the stone that increases its graded colour value according to industry standard grading systems such as the GIA Colour Grading Scale.

The diamond selected for treatment is firstly boiled for 10 minutes in an excess of sulphuric and nitric acids to remove any surface impurities. It is then boiled in a chromic acid preparation with concentrated sulphuric acid for 1 hour to remove any areas of embedded graphite or debris on the surface. Finally, it is washed in distilled water in an ultrasonic bath and left to dry.

The diamond is weighed at 0.105 g. The diamond is then examined under a microscope and photographed under controlled illumination conditions and found to have broad areas of yellow discoloration internally. Next, the diamond is placed carefully in between the ceramic plates of the diamond holder, and a small amount of high temperature alumina ceramic paste is used to cement these parts together, preferably holding the diamond in a manner that ensures the bare minimum of contact with the holder. The holder is then set in place in the main chamber. At this point, the diamond holder is fully retracted and shielded from the main hot zone of the furnace by several layers of heat shielding. 2 kg of highly pure (99.9999%) tin metal is then added into a pyrolytic boron nitride crucible.

Along with this, three pure (99.9999+%) graphite blocks weighing >17 g each are added to ensure a large excess is present during dissolution. The crucible is placed on the heater stage and the chamber sealed.

The chamber is first evacuated to high vacuum (below 0.001 Pa) pressure using the attached turbomolecular vacuum pump and flushed with high purity, $O_2$ and $H_2O$ gettered argon. Power is then applied to the heating element and the system left to equilibrate and outgas at 300° C. After 1 hour, the system is then flushed with argon 2 more times and then pumped back down to high vacuum (i.e. below 0.001 Pa) pressure using the turbomolecular pump attached. Now power is applied carefully to the heater to raise the temperature of the element to 1800° C. over several hours.

Once the system has stabilised at high temperature, the plunger assembly is lowered into the liquid metal and used to hold the graphite blocks just below the metal surface. The linear manipulator controlling the height of the remote plasma source is moved so that the aperture of the plasma source is held 10 cm above the meniscus of the molten metal. Hydrogen is fed into the main body of the remote plasma source at a rate of 10 cm, and the power supply activated. The system is left for between 10-60 minutes to ensure that any microscopic fragments of graphite emerging from the blocks float to the top of the metal meniscus and are etched away. The power density of the hydrogen plasma is kept below 10 W/cm$^3$ to avoid heating the surface of the metal meniscus too much, and to ensure unwanted reactivity or etching of materials outside the immediate area is kept to a minimum. During this period, the plunger slowly pushes the graphite blocks down through the molten metal towards the hottest region of metal at the base of the crucible. The heater temperature is then lowered to 1750 C and left for 15 minutes to ensure that the molten metal is saturated with carbon with respect to diamond.

The diamond holder is then lowered and rotated into the path of the plasma source and left for 10 minutes to etch away any other microscopic graphitic features that may not have been removed during the acid cleaning steps prior to treatment. The diamond is then immersed just below the molten metal meniscus for over 1 hour to allow the annealing to occur. During this period, the hydrogen plasma source is moved to 6 cm above the metal meniscus to provide a means of etching away graphitic nuclei that can form on or near the meniscus. These can be a problem if they form within or near the diamond under treatment so the presence of the atomic hydrogen at the surface prevents this occurring.

Once the treatment is completed, the plasma source is moved up away from the metal meniscus. At this stage either:—
1) The power applied to the heater is then gently lowered so that the internal temperature of the molten tin registers 500° C. at the plunger. The diamond holder assembly is then removed, held in front of the plasma for 5 minutes and then withdrawn and placed behind the heat shielding. The plunger holding the graphite blocks at the bottom of the crucible is also withdrawn to the starting position.
Or:—
2) The power applied to the heater is then lowered gently until the molten tin registers 1400° C. at the plunger. The diamond holder assembly is then removed, held in front of the plasma for 5 minutes and then withdrawn and placed behind the heat shielding. The heater power is then gently ramped down until the temperature at the plunger registers 500° C. The plunger is then withdrawn from the crucible to the starting position.

The apparatus is left to cool, brought up to atmospheric pressure using argon gas and the diamond holder removed. Once removed from the holder, the diamond is again boiled for 10 minutes in nitric and sulphuric acids to remove any surface contamination then examined under a microscope. The diamond is then photographed in controlled conditions and a position identical to the pre-treatment photographs. The diamond is found to have reduced both the density of the yellow discoloration and the size of the discoloured areas. The diamond is then reweighed and found to weigh 0.104 g, indicating that no significant mass change had occurred. Importantly, no appreciable surface degradation due to graphitisation or dissolution can be observed.

The invention claimed is:
1. A method of treating a diamond, comprising:
providing a liquid metal saturated with carbon with respect to graphite precipitation;
lowering the temperature of the liquid metal such that the liquid metal is saturated with carbon with respect to diamond precipitation;
immersing a diamond in the liquid metal and annealing the diamond;
exposing the liquid metal to atomic hydrogen plasma and/or atomic hydrogen radicals while the diamond is immersed in the liquid metal; and
removing the diamond from the liquid metal.
2. The method according to claim 1, wherein the method is a method of reducing defects in a diamond and/or improving the optical properties of a diamond, and wherein the diamond is immersed in the liquid metal to reduce the defects in the diamond and/or improve the optical properties of the diamond.
3. The method according to claim 1, wherein the method is a method of doping diamond, and wherein the diamond is immersed in the liquid metal in the presence of a dopant to dope the diamond with the dopant.
4. The method according to claim 3, wherein the dopant is selected from boron, sulphur, phosphorus, aluminium and mixtures of two or more thereof.
5. The method according to claim 1, wherein the metal comprises a single metallic element, an alloy, and/or two or more metallic elements.
6. The method according to claim 1, wherein the metal is selected from lead, bismuth, tin, gold, silver, indium, gallium, antimony, nickel, cobalt, aluminum and mixtures of two or more thereof.
7. The method according to claim 6, wherein the metal is lead.
8. The method according to claim 1, wherein the method is carried out in a reaction chamber comprising an inert atmosphere.
9. The method according to claim 1, wherein the liquid metal is at a temperature in the range of from 1000 to 2000° C. when the diamond is immersed in the liquid metal.
10. The method according to claim 9, wherein the liquid metal is at a temperature in the range of from 1550 to 1750° C. when the diamond is immersed in the liquid metal.
11. The method according to claim 1, wherein the liquid metal is cooled to a temperature of below 1500° C. before removing the diamond.
12. The method according to claim 1, wherein the method is carried out at a pressure in the range of from 1 Pa to 133 kPa.
13. The method according to claim 1, wherein the step of providing a liquid metal saturated with carbon with respect to graphite precipitation comprises the steps of:
(a) providing a vessel;
(b) placing a metal in a solid form in the vessel;
(c) placing carbon in the vessel;
(d) optionally providing an inert atmosphere in the vessel; and
(e) heating to provide liquid metal saturated with carbon with respect to graphite precipitation.
14. The method according to claim 1, wherein the liquid metal is heated such that a temperature gradient exists across the liquid metal.
15. The method according to claim 14, wherein the temperature gradient across the liquid metal is at least 10° C. from the base of the liquid, preferably in a vessel, to the meniscus.
16. The method according to claim 1, wherein the source of carbon in the metal is graphite.

17. The method according to claim 1, wherein the diamond is synthetic diamond.

18. The method according to claim 1, wherein the temperature is lowered by from 10 to 50° C. such that the liquid metal is saturated with carbon with respect to diamond precipitation.

* * * * *